(12) United States Patent
Doktar et al.

(10) Patent No.: US 8,645,087 B2
(45) Date of Patent: Feb. 4, 2014

(54) MEASURING OF EARTH FAULT CURRENT

(75) Inventors: Andreas Doktar, Vaasa (FI); Stefan Strandberg, Vörå (FI)

(73) Assignee: Vacon Oyj, Vaasa (FI)

( * ) Notice: Subject to any disclaimer, the term of this patent is extended or adjusted under 35 U.S.C. 154(b) by 506 days.

(21) Appl. No.: 13/088,979

(22) Filed: Apr. 18, 2011

(65) Prior Publication Data

US 2011/0270545 A1   Nov. 3, 2011

(30) Foreign Application Priority Data

May 3, 2010 (FI) ..................................... 20105479

(51) Int. Cl.
*G01R 31/00* (2006.01)
(52) U.S. Cl.
CPC ..................................... *G01R 31/00* (2013.01)
USPC ......................................................... 702/58
(58) Field of Classification Search
USPC ................. 702/58, 60, 64, 182–185
See application file for complete search history.

(56) References Cited

U.S. PATENT DOCUMENTS

| | | | |
|---|---|---|---|
| 5,309,349 A | 5/1994 | Kwan | |
| 5,768,079 A | 6/1998 | Buell | |
| 2005/0099743 A1 | 5/2005 | Lee | |
| 2008/0151445 A1* | 6/2008 | Leppanen | ........................ 361/43 |
| 2011/0057641 A1 | 3/2011 | Finke et al. | |

FOREIGN PATENT DOCUMENTS

| | | |
|---|---|---|
| DE | 102008001025 A1 | 10/2009 |
| EP | 0 490 388 A2 | 6/1992 |
| EP | 1 347 567 A1 | 9/2003 |
| WO | WO 97/14205 A1 | 4/1997 |

OTHER PUBLICATIONS

Debaprasad Kastha et al., "Investigation of Fault Modes of Voltage-Fed Inverter System for Induction Motor Drive," Department of Electrical Engineering, The University of Tennessee, Oct. 4, 1992, pp. 858-866.
Frede Blaabjerg, et al., "Reconstruction of Output Currents and Fault Detection in a B4-inverter With Only One Current Sensor," Aalborg University, Institute of Energy Technology Departent of Electrical Energy Conversion, vol. 1, XP010313118, Oct. 12, 1998 IEEE, pp. 759-766.

* cited by examiner

*Primary Examiner* — Edward Raymond
(74) *Attorney, Agent, or Firm* — Birch, Stewart, Kolasch & Birch, LLP

(57) ABSTRACT

Method and apparatus for measuring an earth fault current in an output circuit of an inverter (INU) operating on the PWM principle and forming alternating-current voltage from direct-current voltage, the output currents ($i_U$, $i_V$ and $i_W$) of which inverter are measured, and which inverter comprises at least two phase switches implemented with power semiconductor components ($V_1$-$V_6$, $D_1$-$D_6$), which switches, controlled by a control unit, connect their own output phases to a positive (+) pole and to a negative (−) pole of a direct-current voltage source such that the phase switches are repeatedly both in different positions and also in the same positions, wherein the results of current measurement during two opposite switch position combinations are recorded in memory, and the earth fault current is calculated by forming a difference of the measurement results of said combinations.

16 Claims, 2 Drawing Sheets

MEASURING OF EARTH FAULT CURRENT

FIELD OF TECHNOLOGY

Figure 1:
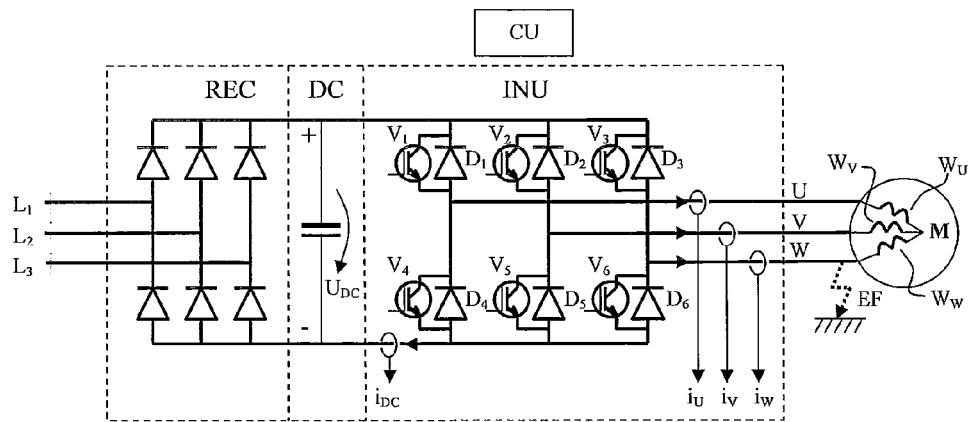

The object of the present invention is a method and an apparatus for the measuring of earth fault current in an output circuit of power converters implemented with switch-type power semiconductor components, more particularly in a motor supplied with a frequency converter, or in a cable connecting them.

DESCRIPTION OF THE PROBLEM AND PRIOR ART

The measurement of an output current formed is known to be included in the normal properties of power converters, e.g. of frequency converters, forming electrical energy. Identifying the current level is a prerequisite for the regulation of output power and for the detection of a fault situation, e.g. of a short-circuit.

A known method for measuring current is using a current transformer based on the Hall effect, which transformer forms a signal that is galvanically isolated from the measured current circuit. Another known method, which is cheaper in terms of costs than a Hall transformer, is to measure the voltage acting over a shunt resistor disposed on the pathway of the main current, which voltage is directly proportional to the current.

The general aim of power converters is to obtain information about the currents of all the conductors supplying output power. For example, frequency converters normally form a three-phase output voltage, the current of all three phases of which can be measured with current transformers disposed in all the phases. Another method that has become known, e.g. from publication U.S. Pat. No. 5,309,349 is to use only one current sensor disposed in the DC intermediate circuit, with which sensor samples of the currents of all three output phases are obtained, and from which samples it is possible to reconstruct the output currents with a certain precision.

One possible fault situation of a motor drive supplied by a frequency converter, which fault situation can be detected by measurement of the output current, is an earth fault in the motor or in the motor cable. When the earth fault is of low impedance, detection is generally possible based on either the sum of the output currents in a fault situation not being 0 as normally or on the measured current level exceeding a pre-defined overcurrent level. On the other hand, when an earth fault occurs via a high impedance, e.g. as a consequence of an incipient insulation defect, detection is more difficult. This is a result of the normal inaccuracy of current sensors, which inaccuracy can be e.g. 3%, and owing to which it is uncertain whether a deviation of this region of magnitude of the current sum from zero means an earth fault or not.

By using more accurate current sensors the uncertainty can be reduced, but this means at the same time a rise in costs, which for commercial reasons is not always possible. On the other hand, also a relatively small earth fault current can cause considerable local heating at the leakage point of the insulation and, via it, a hazardous situation. For example, owing to the 3% inaccuracy in current measurement, with a device with a rated current of 1000 A, an undetected earth fault current can be in the region of 60 A, which can easily cause even a fire.

SUMMARY OF THE INVENTION

The purpose of this invention is to achieve a new type of method and apparatus for detecting an earth fault current, with which method and apparatus an earth fault current level that is lower than the inaccuracy characteristic to a current sensor can be identified, and therefore the aforementioned drawbacks can be avoided. The method is suited both to devices measuring with their own measuring sensors all the output currents as well as to devices measuring with one measuring sensor of DC current. A two-level so-called pulse-width modulation (PWM) frequency converter is used as a descriptive embodiment of an application of the invention, but other applications of the same type that are based on the use of switch-type power semiconductor components are also possible (e.g. a three-level so-called NPC frequency converter). The aim of the invention is achieved with a method, which is characterized by what is stated in the characterization parts of the independent claims. Other preferred embodiments of the invention are the objects of the dependent claims.

The main principle characteristic to the invention is that in the method current measurement results or the sum of them are compared to each other during two opposite switch position combinations. The difference between the measurement results, from which the error of the current sensors is in principle eliminated, is directly proportional to the earth fault current.

The method according to a first embodiment of the invention is suited to an apparatus in which the output currents are measured with one current sensor disposed in the DC intermediate circuit. In the method the result of the current measurement is inspected during the so-called zero vectors of the output switches. The state of the output switches when they are all in the same position is called the zero vector. According to the invention the current measured during the positive zero vector (111, all phase switches in the upper position) is compared to the measured current of the negative zero sector (000, all phase switches in the lower position). If the measurement results differ from each other, it is a sign of an earth fault in the motor circuit, and the difference of the measurement results is directly proportional to the earth fault current.

The methods according to the other embodiments of the invention are suited to an apparatus in which all the output currents are measured with their own current sensors, and in which in the normal situation the sum of all the currents is 0. This type of situation is known e.g. in a motor circuit supplied with a frequency converter. According to the invention in this type of arrangement the sum of the measurement results of all the current sensors is inspected.

According to a second embodiment of the invention, the current sum formed during the positive zero vector is compared to the current sum formed during the negative zero vector. A divergence of the measurement results from each other means an earth fault correspondingly to also in the method according to the first embodiment of the invention.

According to a third embodiment of the invention, the current sums are compared to each other during opposite active vectors of the output switches, e.g. 100 and 011. The criterion for the detection and magnitude of an earth fault is in this case also the same as in the method according to the first embodiment of the invention. In this example case the active sectors are those in which the U-phase is in a different position than the other two phases, in which case an earth fault occurring in precisely the U-phase causes a measurement result of a different magnitude than an earth fault occurring in the other phases. This is because it is only the own impedance of the conductor that limits the earth fault current in the U-phase conductor, whereas the earth fault current traveling via the other phase conductors also encounters the impedance of the motor. With this method, therefore, apart from the presence of an earth fault, also the phase conductor in which said earth fault is most probably located can be determined.

The invention enables the detection of also a very small earth fault current irrespective of the accuracy of the current sensors. It does not require any additional apparatus, so that by means of the invention it is possible without any extra costs to prevent the problems possibly caused by an incipient earth fault.

SHORT DESCRIPTION OF THE DRAWINGS

Figure 2:
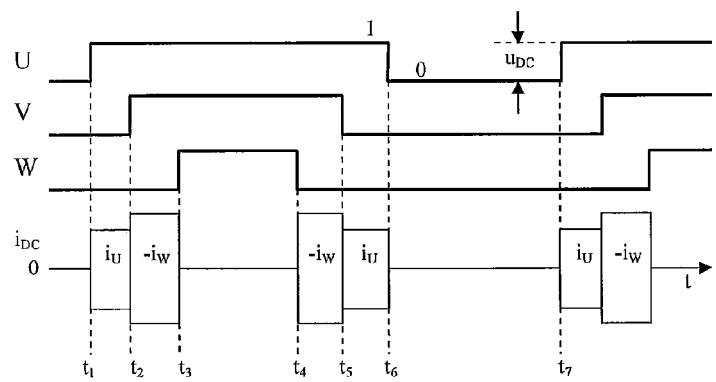
Figure 3:
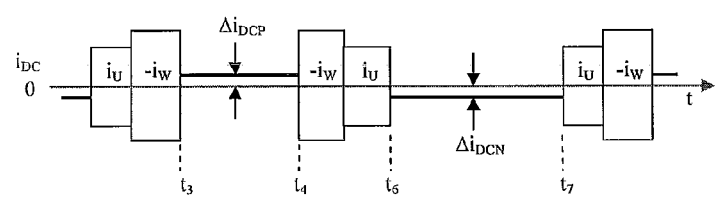
Figure 4:
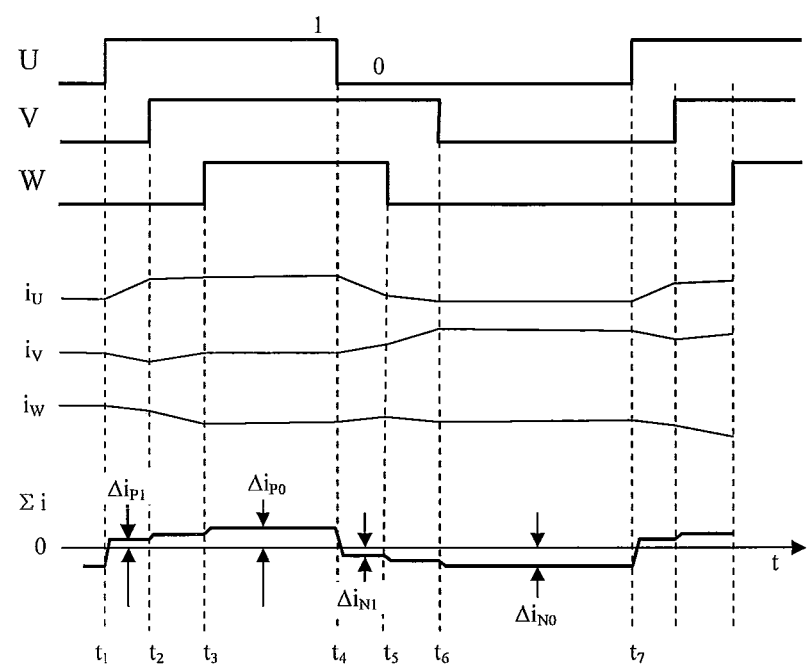

In the following, the invention will be described in more detail by the aid of some examples of its embodiments with reference to the attached drawings, wherein FIG. 1 presents the main circuit and current sensors of a frequency converter drive, FIG. 2 presents a formation in principle of a current measured from the intermediate circuit according to the position of the phase switches, FIG. 3 presents the current, including error components, measured from the intermediate circuit, and FIG. 4 presents the currents measured from the output phases and the sum of said currents.

DETAILED DESCRIPTION OF THE INVENTION

FIG. 1 presents the main circuit of a prior-art three-phase PWM frequency converter, the phase connections intermeshing with the supply network of which main circuit are $L_1$-$L_3$ and the output phase connections U, V, W, which are connected to the motor M, which comprises phase-specific, in this embodiment star-connected, stator windings $W_U$, $W_V$ and $W_W$. The voltage of the supply network is rectified with the diode bridge REC, filtered in the DC intermediate circuit into the DC voltage $U_{DC}$, and inverted into three-phase output voltage of the frequency and voltage level desired in the inverter INU, which inverter consists of controllable power semiconductor switches (e.g. IGBTs) $V_1$-$V_6$ as well as so-called zero diodes $D_1$-$D_6$ connected in parallel with them. The power semiconductor switches and zero diodes belonging to the same phase form three so-called phase switches, which can connect the output connectors either to the positive (+) pole or to the negative (−) pole of the DC intermediate circuit. For example, when $V_1$ conducts, the U-phase switch is in the (+) position (for which the code 1 is used) and when $V_4$ conducts, the U-phase switch is in the (−) position (code 0). Exactly these code numbers are used in the so-called vector presentation of output voltages to describe the positions of the phase switches, e.g. the output voltage vector 100 means that the U-phase is in the (+) position when $V_1$ is conducting and the V-phase and W-phase are in the (−) position when $V_5$ and $V_6$ are conducting. The operation of the frequency converter is controlled by a control unit CU, which inter alia determines the instantaneous values of the output voltage vectors used and receives the measurement results of the current sensors. The current supplied to the motor by the frequency converter can be measured according to the figure e.g. with one current sensor (measuring signal $i_{DC}$) disposed in the DC intermediate circuit or with three current sensors (measuring signals $i_U$, $i_V$ and $i_W$) disposed in the output phases. The positive directions of the currents measured by the current sensors, which directions are used in the description of this invention, are marked with arrowheads marked next to the sensors.

The point of occurrence of one possible earth fault EF is also marked in the figure, which point in this example means a direct contact from the W-phase conductor to earth potential resulting from insulation damage.

FIG. 2 contains a presentation in principle of how a current signal $i_{DC}$ detected by a current sensor disposed in the DC intermediate circuit depends on the output voltage vector, i.e. on the positions of the phase switches U, V, W. For example, before the moment in time $t_1$, when all the phases are in the lower position (vector 000), the current signal $i_{DC}$ is 0. At the moment $t_1$ the U-phase switch turns to the (+) position (vector 100), in which case the current measured by the $i_{DC}$ sensor is the same as $i_U$, the value of which can be either positive or negative and which is described with a rectangle. Further, at the moment $t_2$ the V-phase switch also turns to the (+) position (vector 110), in which case the current measured by $i_{DC}$ is the same as the inverse of the current of the W-phase, i.e. $-i_W$. A detailed explanation of the connectedness of the current measurement $i_{DC}$ of the intermediate circuit and of the output currents $i_U$, $i_V$, $i_W$ with each other in different vector combinations can be found inter alia in patent publication U.S. Pat. No. 5,309,349.

It is seen from FIG. 3 how an earth fault of an output phase appears in the measurement of the current of the DC intermediate circuit. Between the moments in time marked in the figures the output switches are presumed to be in the same positions as between the corresponding moments in time in FIG. 2. In the time interval $t_3$-$t_4$, when the output voltage vector is in the position 111, the measured current is positive (because the potential of the (+) pole of the DC intermediate circuit with respect to earth is positive) and its value is $\Delta i_{DCP}$. Correspondingly, in the time interval $t_6$-$t_7$, when the output voltage vector is 000, the measured current is negative $\Delta i_{DCN}$.

The general principle for the inaccuracy of a current sensor is known to be that it contains both a scaling error and an offset error $k_2$, in which case the measurement result $i_M$ reported by the sensor from the actual current $i_R$ is according to equation 1:

$$i_M = k_1 \times i_R + k_2 \qquad (1)$$

When the supply voltage system of the frequency converter is symmetrical and it is earthed at its center point, the actual earth fault current $i_G$ is also symmetrical, i.e. its absolute value is the same during both the positive and the negative vector. According to the invention a difference of the measurement results $\Delta i_{DCP}$ and $\Delta i_{DCN}$ is formed, from which difference the offset error $k_2$ consequently disappears, and the final result remains according to equation 2:

$$\Delta i_{DCP} - \Delta i_{DCN} = 2 \times k_1 \times i_G \qquad (2)$$

According to the invention the measurement result of the earth fault current is thus half of the difference of the measurement results $\Delta i_{DCP}$ and $\Delta i_{DCN}$, and the only error factor affecting it is the scaling error $k_1$.

The measurements according to the second and third embodiment of the invention are presented in FIG. 4. The uppermost in it describes the positions of the phase switches U, V, W, below them the corresponding instantaneous values of the phase currents $i_U$, $i_V$, $i_W$, and the lowermost are the instantaneous values of the sum $\Sigma i$ of the phase currents.

According to the second embodiment of the invention, the sum of the measurement results of the phase currents during the positive zero vector 111 are calculated ($\Delta i_{P0}$ in the time interval $t_3$-$t_4$) and during the negative zero vector 000 ($\Delta i_{N0}$ in the time interval $t_6$-$t_7$) and the difference of the current sums thus formed is calculated. Correspondingly to the first embodiment of the invention, the offset errors of the current sensors are fully eliminated from the final result of the calculation, and when the scaling error is tuned to be insignificant an accurate result for the actual earth fault current is obtained as the final result.

According to the third embodiment of the invention, the sums of the measurement results of the phase currents during opposite active vectors are calculated. In the example of FIG. 4 in the time interval $t_1$-$t_2$ a first measurement result $\Delta i_{P1}$ is obtained during the active vector 100, and in the time interval $t_4$-$t_5$ a second measurement result $\Delta i_{N1}$ is obtained during the opposite active vector 011. The difference of these measurement results is proportional to the actual earth fault current correspondingly to the other embodiments of the invention.

In this example case the active vectors are those in which the U-phase is in a different position than the other two phases, in which case an earth fault occurring in precisely the U-phase causes a measurement result of a different magnitude than an earth fault occurring in the other phases. This is because it is only the own impedance of the conductor that limits the earth fault current in the U-phase conductor, whereas the earth fault current traveling via the other phase conductors also encounters the impedance of the phase windings $W_U$, $W_V$ or $W_W$ of the motor. Based on this, with this embodiment of the invention, therefore, apart from the presence of an earth fault, also the phase conductor in which said earth fault is most probably located can be determined.

It is obvious to the person skilled in the art that the different embodiments of the invention are not limited solely to the examples described above, but that they may be varied within the scope of the claims presented below.

The invention claimed is:

1. Method for measuring an earth fault current in an output circuit of an inverter (INU) operating on the PWM principle and forming alternating-current voltage from direct-current voltage,
   the output currents ($i_U$, $i_V$ and $i_W$) of which inverter are measured, and
   which inverter comprises at least two phase switches implemented with power semiconductor components ($V_1$-$V_6$, $D_1$-$D_6$), which switches, controlled by a control unit, connect their own output phases to a positive (+) pole and to a negative (−) pole of a direct-current voltage source such that the phase switches are repeatedly both in different positions and also in the same positions,
   characterized in that
   in the method the results of current measurement during two opposite switch position combinations are recorded in memory, and
   the earth fault current is calculated by forming a difference of the measurement results of said combinations.

2. Method according to claim 1,
characterized in that
the output current of the inverter is measured by means of a current sensor disposed in the DC intermediate circuit, and
the measurement results of current needed for calculating the earth fault current are recorded in memory when all the output phases are in the (+) position and when all the output phases are in the (−) position.

3. Method according to claim 2,
characterized in that
the value of an earth fault current is calculated to be half the difference of the measurement results ($\Delta i_{DCP}$ and $\Delta i_{DCN}$, $\Delta i_{P0}$ and $\Delta i_{N0}$, $\Delta i_{P1}$ and $\Delta i_{N1}$) recorded in memory during opposite switch position combinations.

4. Method according to claim 1,
characterized in that
the output current of the inverter is measured from each output phase with its own current sensors, and
the phase-specific measurement results of current are summed together, and
the measurement results of current from all the phases are recorded in memory when all the output phases are in the (+) position and when all the output phases are in the (−) position.

5. Method according to claim 4,
characterized in that
the value of an earth fault current is calculated to be half the difference of the measurement results ($\Delta i_{DCP}$ and $\Delta i_{DCN}$, $\Delta i_{P0}$ and $\Delta i_{N0}$, $\Delta i_{P1}$ and $\Delta i_{N1}$) recorded in memory during opposite switch position combinations.

6. Method according to claim 1,
characterized in that
the output current of the inverter is measured from each output phase with its own current sensors, and
the phase-specific measurement results of current are summed together, and
the measurement results of current from all the phases are recorded in memory when one output phase is in the (+) position and the other output phases are in the (−) position, and when the same output phase is in the (−) position and the other output phases are in the (+) position.

7. Method according to claim 6,
characterized in that
the value of an earth fault current is calculated to be half the difference of the measurement results ($\Delta i_{DCP}$ and $\Delta i_{DCN}$, $\Delta i_{P0}$ and $\Delta i_{N0}$, $\Delta i_{P1}$ and $\Delta i_{N1}$) recorded in memory during opposite switch position combinations.

8. Method according to claim 1,
characterized in that
the value of an earth fault current is calculated to be half the difference of the measurement results ($\Delta i_{DCP}$ and $\Delta i_{DCN}$, $\Delta i_{P0}$ and $\Delta i_{N0}$, $\Delta i_{P1}$ and $\Delta i_{N1}$) recorded in memory during opposite switch position combinations.

9. Apparatus for measuring an earth fault current in an output circuit of an inverter (INU) operating on the PWM principle and forming alternating-current voltage from direct-current voltage,
   which apparatus comprises means for measuring the output currents ($i_U$, $i_V$ and $i_W$) of an inverter, and
   which inverter comprises at least two phase switches implemented with power semiconductor components ($V_1$-$V_6$, $D_1$-$D_6$), which switches, controlled by a control unit, connect their own output phases to a positive (+) pole and to a negative (−) pole of a direct-current voltage source such that the phase switches are repeatedly both in different positions and also in the same positions,
   characterized in that the apparatus is fitted
   to record in memory the results of current measurement during two opposite switch position combinations, and
   to calculate the earth fault current by forming a difference of the measurement results of said combinations.

10. Apparatus according to claim 9,
characterized in that
the output currents of the inverter are measured by means of a current sensor disposed in the DC intermediate circuit, and
the apparatus comprises a memory, in which case the measurement results of current needed for calculating the earth fault current are recorded in memory when all the output phases are in the (+) position and when all the output phases are in the (−) position.

11. Apparatus according to claim 10,
characterized in that the apparatus is fitted to calculate the value of an earth fault current such that it is half the difference of the measurement results ($\Delta i_{DCP}$ and $\Delta i_{DCN}$, $\Delta i_{P0}$ and $\Delta i_{N0}$, $\Delta i_{P1}$ and $\Delta i_{N1}$) recorded in memory during opposite switch position combinations.

12. Apparatus according to claim 9,
characterized in that
the output currents of the inverter are measured from each output phase with their own current sensors, and
the apparatus comprises means for summing together the phase-specific measurement results of current, and
the apparatus comprises a memory, in which case the measurement results of current from all the phases are recorded in memory when all the output phases are in the (+) position and when all the output phases are in the (−) position.

13. Apparatus according to claim 12,
characterized in that the apparatus is fitted to calculate the value of an earth fault current such that it is half the difference of the measurement results ($\Delta i_{DCP}$ and $\Delta i_{DCN}$, $\Delta i_{P0}$ and $\Delta i_{N0}$, $\Delta i_{P1}$ and $\Delta i_{N1}$) recorded in memory during opposite switch position combinations.

14. Apparatus according to claim 9,
characterized in that
the output currents of the inverter are measured from each output phase with their own current sensors, and
the apparatus comprises means for summing together the phase-specific measurement results of current, and
the apparatus comprises a memory, in which case the measurement results of current from all the phases are recorded in memory when one output phase is in the (+) position and the other output phases are in the (−) position, and when the same output phase is in the (−) position and the other output phases are in the (+) position.

15. Apparatus according to claim 14,
characterized in that the apparatus is fitted to calculate the value of an earth fault current such that it is half the difference of the measurement results ($\Delta i_{DCP}$ and $\Delta i_{DCN}$, $\Delta i_{P0}$ and $\Delta i_{N0}$, $\Delta i_{P1}$ and $\Delta i_{N1}$) recorded in memory during opposite switch position combinations.

16. Apparatus according to claim 9,
characterized in that the apparatus is fitted to calculate the value of an earth fault current such that it is half the difference of the measurement results ($\Delta i_{DCP}$ and $\Delta i_{DCN}$, $\Delta i_{P0}$ and $\Delta i_{N0}$, $\Delta i_{P1}$ and $\Delta i_{N1}$) recorded in memory during opposite switch position combinations.

\* \* \* \* \*